United States Patent
Park et al.

(10) Patent No.: US 10,355,820 B2
(45) Date of Patent: Jul. 16, 2019

(54) DECODING METHOD AND APPARATUS IN SYSTEM USING SEQUENTIALLY CONNECTED BINARY CODES

(71) Applicant: Samsung Electronics Co., Ltd, Gyeonggi-do (KR)

(72) Inventors: Woomyoung Park, Gyeonggi-do (KR); Sangmin Kim, Gyeonggi-do (KR); Chiwoo Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 15/511,615

(22) PCT Filed: Sep. 15, 2015

(86) PCT No.: PCT/KR2015/009686
§ 371 (c)(1),
(2) Date: Mar. 15, 2017

(87) PCT Pub. No.: WO2016/043509
PCT Pub. Date: Mar. 24, 2016

(65) Prior Publication Data
US 2017/0264393 A1 Sep. 14, 2017

(30) Foreign Application Priority Data
Sep. 15, 2014 (KR) .......................... 10-2014-0121920

(51) Int. Cl.
*H04L 1/00* (2006.01)
*H03M 13/27* (2006.01)
(Continued)

(52) U.S. Cl.
CPC ....... *H04L 1/0054* (2013.01); *H03M 13/1191* (2013.01); *H03M 13/255* (2013.01);
(Continued)

(58) Field of Classification Search
CPC ..... H04L 1/005; H04L 1/0057; H04L 25/067; H04L 27/2649; H03M 13/2957; H03M 13/2963
See application file for complete search history.

(56) References Cited

U.S. PATENT DOCUMENTS

2009/0177945 A1 7/2009 Djordjevic et al.
2010/0050048 A1* 2/2010 Djordjevic ......... H03M 13/1117
714/755
(Continued)

FOREIGN PATENT DOCUMENTS

JP 2008167435 A 7/2008
KR 1020090059893 A 6/2009
KR 1020110060151 A 6/2011

OTHER PUBLICATIONS

International Search Report dated Dec. 23, 2015 in connection with International Application No. PCT/KR2015/009686, 5 pages.
(Continued)

Primary Examiner — David S Huang

(57) ABSTRACT

The present disclosure relates to a 5G or pre-5G communication system to be provided to support a data transmission rate higher than that of a 4-G communication system, such as LTE, and subsequent communication systems. An apparatus according to one embodiment of the present invention can comprise: a first grouping unit for performing repeated decoding by using an outer decoder and an inner decoder, and grouping, in correspondence to a decoding order, a bit stream, which is received from the outer decoder, from a receiver of a system using binary irregular repeat partial accumulate codes to the inner decoder device; an LLR symbol selection unit for calculating indices of grouped bits having the maximum probability value among the grouped bits, and selecting and outputting a predetermined number of grouped bit LLR values by using the indices of the grouped
(Continued)

bits having the maximum probability value; an LLR symbol conversion unit for converting the grouped bit LLR values outputted from the LLR symbol selection unit into symbol LLR values, and outputting the same; a Bahl-Cocke-Jelinek-Raviv (BCJR) processing unit for performing a BCJR algorithm operation on the symbol LLR values; a bit LLR calculation unit for converting an output of the BCJR processing unit into bit LLR values; and a second bit grouping unit for grouping the bit LLR values by predetermined bit units.

20 Claims, 8 Drawing Sheets

(51) Int. Cl.
  *H03M 13/11* (2006.01)
  *H03M 13/25* (2006.01)
  *H03M 13/29* (2006.01)
  *H03M 13/37* (2006.01)
  *H03M 13/00* (2006.01)
  *H04L 27/34* (2006.01)
(52) U.S. Cl.
  CPC ....... *H03M 13/27* (2013.01); *H03M 13/2957* (2013.01); *H03M 13/3746* (2013.01); *H03M 13/6325* (2013.01); *H04L 1/005* (2013.01); *H03M 13/1102* (2013.01); *H03M 13/1111* (2013.01); *H04L 1/0071* (2013.01); *H04L 27/34* (2013.01)

(56) References Cited

U.S. PATENT DOCUMENTS

| 2010/0266069 | A1 | 10/2010 | Nam et al. |
| 2012/0047415 | A1* | 2/2012 | Djordjevic ......... H03M 13/1117 714/756 |
| 2013/0019141 | A1 | 1/2013 | Wang et al. |
| 2013/0246894 | A1 | 9/2013 | Declercq et al. |

OTHER PUBLICATIONS

Written Opinion of the International Searching Authority dated Dec. 23, 2015 in connection with International Application No. PCT/KR2015/009686, 5 pages.

S. Schwandter, et al., "Complexity Reduction in BICM-ID Systems through Selective Log-Likelihood Ratio Updates", In: Signal Processing Advances in Wireless Communication (SPAWC), 2010 IEEE Eleventh International Workshop, Jun. 2010, 6 pages.

Khoirul Anwar, et al., "Very Simple BICM-ID Using Repetition Code and Extended Mapping with Doped Accumulator", In: Wireless Personal Communications, Dec. 2012, vol. 67, Issue 3, 17 pages.

* cited by examiner

DECODING METHOD AND APPARATUS IN SYSTEM USING SEQUENTIALLY CONNECTED BINARY CODES

TECHNICAL FIELD

The present invention relates to a decoding method and apparatus in a system using sequentially connected binary codes and, in particular, to a decoding method and apparatus for reducing complexity in the system using the sequentially connected binary codes.

BACKGROUND ART

In order to meet the increasing demand for wireless data traffic since the commercialization of 4G communication systems, the development focus is on the $5^{th}$ Generation (5G) or pre-5G communication system. For this reason, the 5G or pre-5G communication system is called a beyond 4G network communication system or post Long Term Evolution (LTE) system.

Consideration is being given to implementing the 5G communication system in millimeter wave (mmWave) frequency bands (e.g., 60 GHz bands) to accomplish higher data rates. In order to increase the propagation distance by mitigating propagation loss in the 5G communication system, discussions are underway about various techniques such as beamforming, massive MIMO, Full Dimensional MIMO (FD-MIMO), array antenna, analog beamforming, and large scale antenna.

Also, in order to enhance network performance of the 5G communication system, developments are underway of various techniques such as evolved small cell, advanced small cell, cloud Radio Access Network (cloud RAN), ultra-dense network, Device to Device (D2D) communication, wireless backhaul, moving network, cooperative communication, Coordinated Multi-Points (CoMP), and interference cancellation.

Furthermore, the ongoing research for 5G system includes the use of Hybrid FSK and QAM Modulation (FQAM) and Sliding Window Superposition Coding (SWSC) as Advanced Coding Modulation (ACM), Filter Bank Multi Carrier (FBMC), Non-Orthogonal Multiple Access (NOMA), and Sparse Code Multiple Access (SCMA).

With the advance of electronic technologies, various types of inter-device data communication methods are developed. Particularly when remote devices are communicating data through a radio channel, the data are likely to be modulated and coded. In the case of wireless data communication between electronic devices, e.g., between a portable terminal and a base station or an access point, it is typical to assume a Gaussian interference environment to operate the system with a low complexity. In order for the interference signals to show close to the Gaussian characteristics, QAM schemes have been used.

In a comparison between the Gaussian channel environment and non-Gaussian channel environment in a wireless communication, it is shown that the non-Gaussian channel has a channel capacity greater than that of the Gaussian channel. Since the non-Gaussian channel capacity is greater than the channel capacity under the assumption of the Gaussian channel, it may be possible to accomplish more network throughput on the non-Gaussian channel than that on the Gaussian channel.

With the recent requirements for advances in data rates, there is a need to develop a modulation scheme capable of modeling interference signals with non-Gaussian characteristics for throughput enhancement in a wireless communication system. As one of such modulation schemes for modeling the channel interference showing non-Gaussian characteristics, the FQAM scheme has been proposed.

In order to increase data throughput with FQAM, it is necessary to use a channel coding scheme suited to the corresponding modulation scheme. In the case of using a modulation scheme with a modulation order of q, it may be possible to secure the logical channel capacity using a Coded Modulation (CM) scheme employing a non-binary channel code with the same order; however, the non-binary channel code has a drawback in having very high complexity in comparison with a binary code.

Legacy QAM series modulation schemes can accomplish throughput close to the logical channel capacity using a Bit-Interleaved Coded Modulation (BICM) scheme with a Gray mapping. However, it is impossible to accomplish any intended throughput using the FQAM scheme along with the BICM scheme. BICM with Integrative Decoding (BICM-ID) is a modulation scheme proposed to overcome this problem in such a way of iterative decoding between a decoder and a demodulator. By applying an Irregular Repeat Partially Accumulate (IRPA) code-based BICM-ID scheme to the FQAM scheme, it is possible to achieve throughput close to the logical channel capacity.

Here, the IRPA code-based BICM-ID decoder may consist of an inner decoder and an outer decoder. A receiver performs decoding in an iterative manner such that the inner decoder and the outer decoder exchange soft message processing results repeatedly. The decoding scheme of the IRPA code-based BICM-ID decoder operating as above has a drawback in having very high complexity. For example, although the outer decoder, which performs calculation on message nodes, does not contribute to the complexity, the inner decoder has very high complexity.

DISCLOSURE OF INVENTION

Technical Problem

The present invention provides an apparatus and method for reducing the complexity of a binary IRPA code-based BICM-ID decoder.

Also, the present invention provides an apparatus and method for minimizing performance degradation of the binary IRPA code-based BICM-ID decoder while reducing the complexity of a binary IRPA code-based BICM-ID decoder.

Solution to Problem

In accordance with an aspect of the present invention, an inner decoder of a receiver equipped with the inner decoder and an outer decoder for iterative decoding in a system using a binary irregular repeat and partial accumulate code includes a first grouping unit which groups bits received from the outer decoder according to a decoding order, an LLR symbol selection unit which calculates indices of the grouped bits with a highest probability among the grouped bits and selects and outputs a predetermined number of grouped bit LLR values, an LLR symbol conversion unit which converts the grouped bit LLR values output by the LLR symbol selection unit to symbol LLR values and outputs the symbol LLR values, a Bahl-Cocke-Jelinek-Raviv (BCJR) processing unit which performs a BCJR algorithm on the symbol LLR values, a bit LLR calculation unit which converts outputs of the BCJR processing unit to bit LLR values, and a second bit grouping unit which groups the bit LLR values in units of a predetermined number of bits.

In accordance with another aspect of the present invention, a decoding method of an inner decoder of a receiver of a system performing iterative decoding with the inner decoder and an outer decoder and using a binary irregular repeat and partial accumulate code includes grouping bits received from the outer decoder according to a decoding order, calculating indices of the grouped bits with a highest probability among the grouped bits, selecting and outputting a predetermined number of grouped bit LLR values, converting the grouped bit LLR values to symbol LLR values and outputting the symbol LLR values, performing a BCJR algorithm on the symbol LLR values, converting BCJR processing results to bit LLR values, and grouping the bit LLR values in units of a predetermined number of bits.

In accordance with another aspect of the present invention, an inner decoder of a receiver equipped with the inner decoder and an outer decoder for iterative decoding in a system using a binary irregular repeat and partial accumulate code includes a first grouping unit which groups bits received from the outer decoder according to a decoding order, an LLR symbol conversion unit which converts the grouped bits to LLR symbols, an LLR symbol truncation unit which sorts elements of vectors of the LLR symbols in an order of size and selects a predetermined number of symbol LLR values in series in a descending order of symbol LLR value, a Bahl-Cocke-Jelinek-Raviv (BCJR) processing unit which performs a BCJR algorithm on the symbol LLR values output from the BCJR processing unit, a bit LLR calculation unit which converts outputs of the BCJR processing unit to bit LLR values, and a second bit grouping unit which groups the bit LLR values in units of a predetermined number of bits.

In accordance with still another aspect of the present invention, a decoding method of an inner decoder of a receiver of a system performing iterative decoding with the inner decoder and an outer decoder and using a binary irregular repeat and partial accumulate code includes grouping bits received from the outer decoder according to a decoding order, converting the grouped bits to LLR symbols, sorting elements of vectors of the LLR symbols in an order of size and selecting a predetermined number of symbol LLR values in series in a descending order of symbol LLR value, performing a BCJR algorithm on the symbol LLR values, converting BCJR process results to bit LLR values, and grouping the bit LLR values in units of a predetermined number of bits.

Advantageous Effects of Invention

The binary IRPA code-based BICM-ID decoder of the present invention is advantageous in terms of reducing decoding complexity without compromising performance degradation. Also, the binary IRPA code-based BICM-ID decoder is advantageous in terms of accomplishing a high processing yield with a parallel structure.

MODE FOR THE INVENTION

Exemplary embodiments of the present invention are described in detail with reference to the accompanying drawings. The same reference numbers are used throughout the drawings to refer to the same or like parts. The drawings are provided to help an understanding of the present invention, and they are not intended to be limiting the present invention in shape and arrangement. Detailed descriptions of well-known functions and structures incorporated herein may be omitted to avoid obscuring the subject matter of the present invention. In the following, descriptions are made of only the parts necessary for understanding the operations in accordance with various embodiments of the present invention and not for the other parts to avoid obscuring the subject matter of the present invention.

Figure 1:
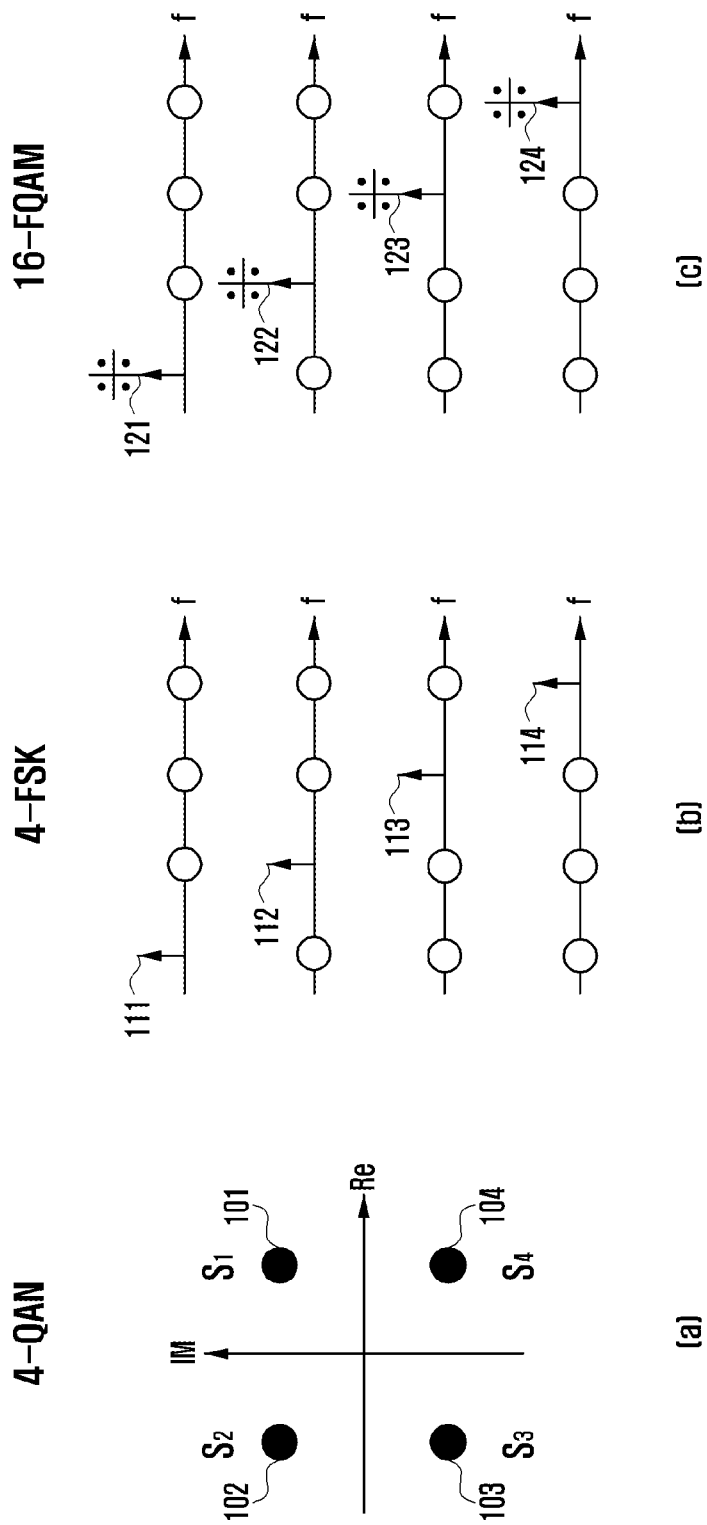
FIG. 1 is a conceptual diagram for explaining an FQAM scheme with non-Gaussian characteristics.

FIG. 1 is a conceptual diagram for explaining an FQAM scheme with non-Gaussian characteristics.

Parts (a), (b), and (c) of FIG. 1 shows three constellation patterns. In reference to FIG. 1, part (a) shows a constellation pattern with 4 points 101, 102, 103, and 104 corresponding to symbols of the 4-QAM scheme. In the 4-QAM scheme, the data symbols are mapped to the constellation points $S_1$ 101, $S_2$ 102, $S_3$ 103, and $S_4$ 104 represented as coordinates of a real number axis and an imaginary number axis as shown in part (a) of FIG. 1. Part (b) of FIG. 1 shows a constellation pattern of a 4-FSK scheme in which data symbols are mapped to 4 different frequency bands 111, 112, 113, and 114. For example, four different items of data may each be mapped to frequency bands 111, 112, 113, and 114, respectively.

Part (c) of FIG. 1 shows a constellation pattern of the FQAM with non-Gaussian characteristics as a hybrid modulation scheme combining the 4-QAM scheme exemplified in part (a) of FIG. 1 and the 4-FSK scheme exemplified in part (b) of FIG. 1. In the case of mapping data to the constellation pattern for the combination of the 4-QAM and 4-FSK schemes as shown in part (c) of FIG. 1, the interference signal shows the non-Gaussian characteristics similar to those in an FSK scheme. The FQAM scheme exemplified in part (c) of FIG. 1 shows constellation patterns to which 4-QAM symbols are mapped to the respective frequency bands as denoted by reference numbers 121, 122, 123, and 124. Accordingly, the pattern exemplified in part (c) of FIG. 1 represents the 16-FQAM scheme. Such an FQAM scheme is capable of improving spectral efficiency in comparison with an FSK modulation scheme by applying a QAM scheme along with an FSK modulation scheme.

Typically, a cellular radio communication system has a drawback in that a terminal located at a cell edge cannot be assigned a high data rate; however, in the case of using the FQAM scheme the statistical characteristics of Inter-Cell Interference (ICI) show non-Gaussian distribution at the terminal. Since the channel capacity increases as the non-Gaussian characteristics are deepened in the FQAM scheme, it becomes possible for the cell edge terminal to perform data transmission at a high data rate.

A description is made hereinafter of the method for transmitting/receiving symbols with a FQAM scheme.

A binary IRPA code has a structure in which an outer code is represented by a Binary Irregular Repetition code and an inner code is represented by a Trellis code with the code of 1. This code is characterized in that the message to be transmitted is received in units of bit to repeat every bit a predetermined number of times. Here, the number of repetitions per bit may be irregular. The repeated bits are mixed arbitrarily by an interleaver and then grouped in units of a predetermined number of bits. The bit strings output as the grouping result may be coded by an inner coder. That is, the binary IRPA encoder generates a binary irregular repetition code, which is interleaved by an interleaver and then channel coded by a binary channel coder. The codeword coded as above can be modulated by an FQAM modulator. The modulated signal may be transmitted to a receiver through a predetermined channel.

The signal received by the receiver may be modulated by a modulator so as to be output as a soft message. This soft message is decoded in such a way of being repeated between a Bahl-Cocke-Jelinek-Raviv (BCJR) algorithm-based inner decoder and a binary outer decoder to be decoded. Here, the outer decoder operates based on a Bit Log Likelihood Ratio (LLR) message processing to perform very simple computation. In contrast, the inner decoder operates based on a Symbol LLR vector processing as a non-binary message processing.

Figure 2:
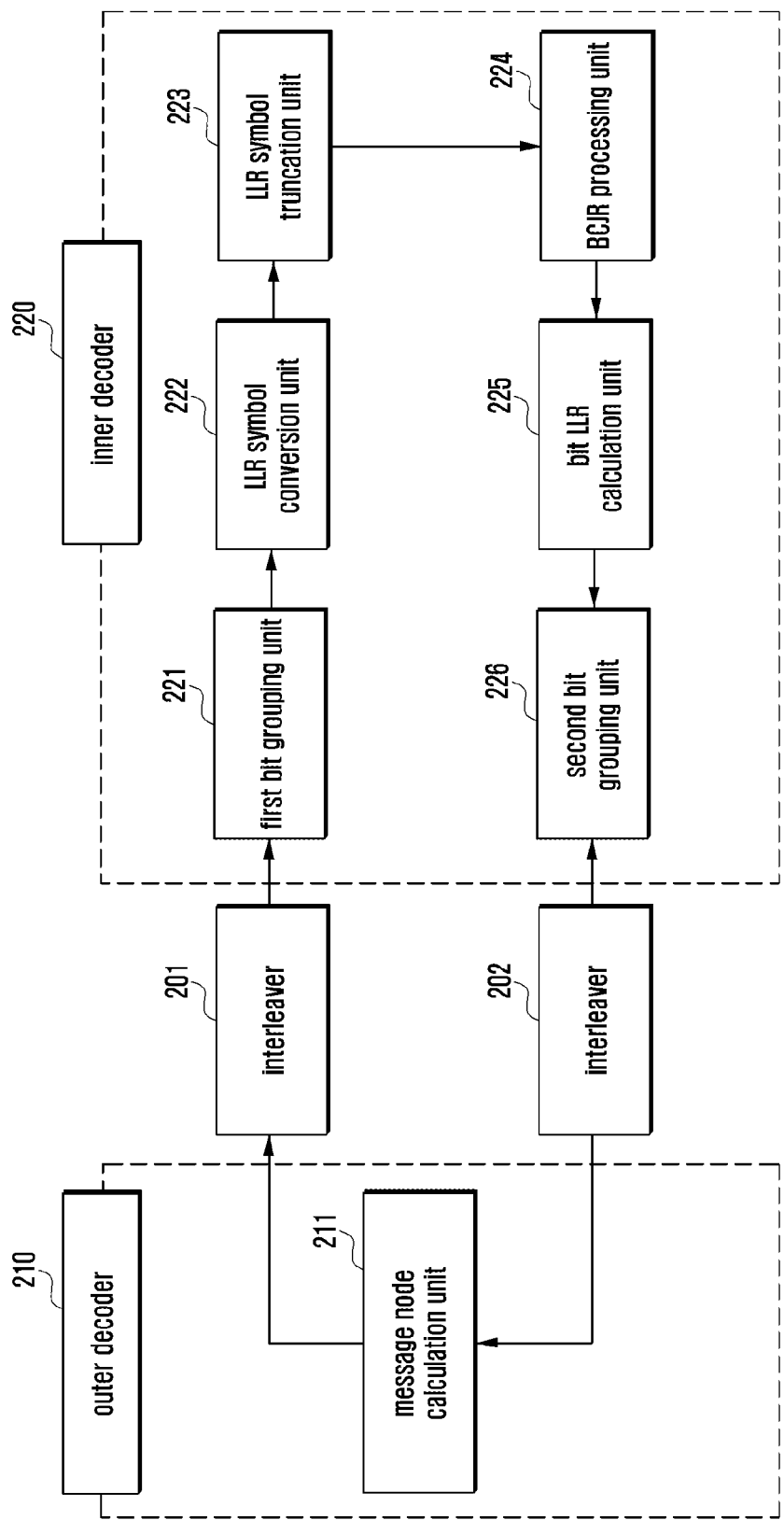
FIG. 2 is a block diagram illustrating a configuration of a binary IRPA code decoder to which the FQAM scheme can be applied according to an embodiment of the present invention.

Descriptions are made hereinafter of the configuration and operation of a decoder of a receiver that receives signals using the FQAM scheme of the present invention FIG. 2 is a block diagram illustrating a configuration of a binary IRPA code decoder to which the FQAM scheme can be applied according to an embodiment of the present invention.

In reference to FIG. 2, the binary IRPA code decoder includes an outer decoder 210, an inner decoder 220, an interleaver 201, and a deinterleaver 202. The outer decoder 210 includes a message node calculation unit 211, and the inner decoder 220 includes a first grouping unit 221, an LLR symbol conversion unit 222, an LLR symbol truncation unit 223, a BCJR processing unit 224, a bit LLR calculation unit 225, and a second bit grouping unit 226.

Before beginning the explanation of the decoder configured as above, a brief description is made of the optimal inner decoding algorithm. The optimal inner decoding algorithm has to group messages being exchanged with an outer decoder and perform complex operations such as BCJR algorithm computation of the inner decoder and lookup table computation. In order to simplify this process, it may be possible to perform decoding with an approximation formula similar to the method used in a legacy Turbo code or Low Density Parity Check (LDPC) code decoder.

The operations of the function blocks configured as above are described hereinafter with reference to FIG. 2. At the receiver, if a modulated signal is received and demodulated, the demodulated signal is input to the BCJR processing unit 224. It should be noted that the route through which the demodulated signal is received is not depicted in FIG. 2.

The BCJR algorithm is characterized in that the inner decoder 220 calculates a posteriori LLR value of each code symbol effectively. The LLR value may be calculated by combining the information received through the channel and the extrinsic information of all symbols (with the exception of the symbol as the calculation target), e.g., LLR information received from the outer decoder 210 as a result of the previous iteration. The BCJR processing unit 224 uses an algorithm capable of acquiring the a posteriori LLR value effectively through a forward/backward recursion calculation, as in the Viterbi algorithm, in the trellis of the inner code. Since the BCJR algorithm is well-known in the art, a detailed description thereof is omitted herein.

In the state that the initially demodulated signal is input to the BCJR processing unit 224, there is no previous iteration, resulting in no information received from the outer decoder 210. Accordingly, if the initially demodulated signal is received, the BCJR processing unit 224 configures the algorithm to use only the demodulated signal or a predetermined value, e.g., 0 (zero), set as an input of the outer decoder. The value calculated through the BCJR algorithm at the BCJR processing unit 224 is input to the bit LLR calculation unit 225.

The bit LLR calculation unit 225 performs calculation on the symbol LLR value calculated by the symbol BCJR algorithm to generate a bit LLR value. The bit LLR value calculated by the bit LLR calculation unit 225 is input to the second bit grouping unit 226. The second bit grouping unit 226 restores a series of bit information from the bit LLR value and outputs the bit information to the deinterleaver 202.

The deinterleaver 202 performs deinterleaving in a predetermined manner, e.g., in the reverse process of interleaving at the transmitter, or in the reverse operation of interleaving at the interleaver 201 and outputs the deinterleaved bit information to the message node calculation unit 211 of the outer decoder 210. The message node calculation unit 211 performs outer decoding with the deinterleaved bit information and outputs the outer decoding result to the interleaver 201.

The decoding result of the outer decoder 210 is input to the interleaver 201. If the message calculated by the outer decoder 210 is input to the interleaver 201, the interleaver 201 performs interleaving on the demodulated signal with a predetermined interleaving scheme, e.g., the same scheme used in the transmitter, and outputs the interleaving result to the inner decoder 220. At this time, the interleaver may perform interleaving per bit. Accordingly, the output signal of the interleaver 201 is an interleaved bit signal.

The first bit grouping unit 221 of the inner decoder 220 receives the bits interleaved by the interleaver 201 and sorts the bits into groups, each of which consists of a predetermined number of bits. This is a method for adjusting the code rate of the code. For example, the interleaver 201 may group two interleaved bits into one bit, three interleaved bits into one bit, or four interleaved bits into one bit. That is, the number of bits to be grouped into one bit is determined depending on the code rate of the code.

The first bit grouping unit 221 converts the grouped data into an LLR symbol. The first bit grouping unit 221 may approximate the message received from the outer decoder 210. For example, the first bit grouping unit 221 may perform a log BP calculation using a hyper tangent (tan h) as a non-linear function. Here, the first bit grouping unit 221 may approximate the message with a scaled minimum sum (min-sum) scheme used as at the check nodes of LCDP code. The scaled min-sum scheme performed at the bit grouping unit 221 may calculate the bit LLR value per bit as shown in Formula 1.

$$L_{a_n} \approx \text{sgn}(L_{c_{2n}})\text{sgn}(L_{c_{2n+1}})\sin\{|L_{c_{2n}}|, |L_{c_{2n+1}}|\}$$ [Formula 1]

$$L_{a_n} = \log\frac{Pr[a_n = 0]}{Pr[a_n = 1]}$$

$$L_{c_n} = \log\frac{Pr[c_{2n} = 0]}{Pr[c_{2n} = 1]}$$

In Formula 1, $a_n$ denotes the $n^{th}$ bit among the grouped bits, $c_{2n}$ and $c_{2n+1}$ denote the bits before being grouped, Pr denotes a probability. In Formula 1, a 2-bit grouping is assumed. It is possible to calculate the LLR proximity value of the group bit using the value calculated by Formula 1.

The first bit grouping unit 221 may perform a parity check before bit-unit LLA value determination to determine whether the decoding is successful or not. If no error is detected in the information decoded through the parity check, it is possible to output the interleaved data as the decoding result. The parity error check on the decoding result may be performed at every iteration of the iterative decoding between the inner decoder 220 and the outer decoder 210.

The first bit grouping unit 221 inputs the information converted to the LLR symbol to the LLR symbol conversion unit 222. The LLR symbol conversion unit 222 may calculate the LLR value of m-bit symbol with a combination of the per-bit probability values calculated by Formula 1 as shown in Formula 2.

$$\log Pr[(a_{m+m-1}, \ldots, a_m) = (s_{m-1}, \ldots, s_0) = S] =$$ [Formula 2]
$$\sum_{j=0}^{m-1} \log Pr[a_{im-j} = s_j]$$
$$S \in GF(q), s_j \in \{0, 1\}$$

The LLR symbol truncation unit 223 sorts the elements of the symbol LLR vector calculated by the LLR symbol conversion unit 222 from the largest to the smallest and selects $n_m$ messages in a descending order of the symbol LLR value. That is, the LLR symbol truncation unit 223 may output only $n_m$ selected messages. A description is made of the factors capable of adjusting the $n_m$ selected values.

First, if the channel condition is good, e.g., if the SNR value is high, $n_m$ may be set to a small value; in contrast, if the channel condition is bad, it should be set to a large value.

Second, when performing iterative decoding between the outer decoder and the inner decoder, $n_m$ is set to a large value for the first few iterations and then decreased for the other iterations.

The BCJR processing unit 224 performs the BCJR algorithm on the $n_m$ messages selected by the LLR symbol truncation unit 223. Since only the $n_m$ messages selected among the symbol LLR vector messages are input to the BCJR processing unit 224, it is possible to reduce the calculation complexity of the BCJR processing unit 224.

When selecting the LLR symbols, the LLR symbol truncation unit 223 may perform truncation after sorting the elements of the symbol LLR vector calculated as described above into a descending order or truncate $n_m$ messages randomly from a q-ary symbol LLR vector. In the case of truncating $n_m$ messages randomly, this is advantageous in terms of no extra complexity, but it is disadvantageous in that the low probability of selecting messages with a high reliability may cause significant performance loss. In the case of calculating q symbol LLR message and selecting $n_m$ messages in a descending order of the size, the messages having the highest reliability are selected with priority; thus, it is possible to minimize the performance loss by selecting $n_m$ value appropriately. In contrast, the operation of sorting the $n_m$ values for selection in the order from the largest to the smallest causes extra complexity.

The subsequent operations of the bit LLR calculation unit 225 and the second bit grouping unit 226 have been described above already. If the decoding operation of the inner decoder 220 has been completed, the deinterleaver 202 performs deinterleaving, and the outer decoder 210 performs outer decoding. The iterative decoding may be iteratively performed between the outer decoder 210 and the inner decoder 220 until the decoding is successful.

Figure 3:
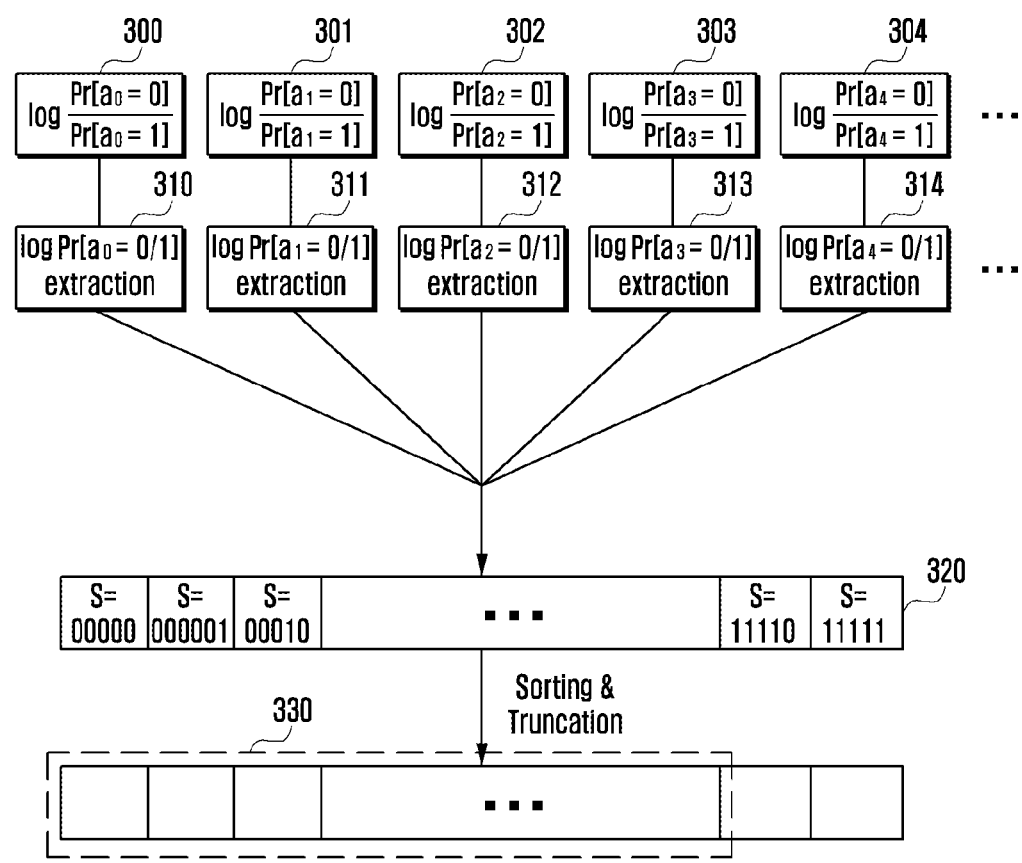
FIG. 3 is a conceptual diagram for explaining a symbol LLR message truncation method in an FQAM scheme according to an embodiment of the present invention.

FIG. 3 is a conceptual diagram for explaining a symbol LLR message truncation method in a FQAM scheme according to an embodiment of the present invention.

In reference to FIG. 3, the grouped bit LLR messages 300, 301, 302, 303, and 304 can be expressed as Formula 1. FIG. 3 exemplifies a case where 5 bit LLR messages are sorted into one group. However, it may also be possible to sort 5 or more bit LLR messages or less than 5 bit LLR messages into one group.

As shown in FIG. 3, it may be possible to extract the probability values of 0 or 1 of the respective bitLLR messages as denoted by reference numbers 310, 311, 312, 313, and 314. After calculating indices as combinations of bit indices as denoted by reference number 320, it may be possible to sort the indices in an order or leave them as they are. By truncating the $n_m$ messages selected among the indices sorted or not sorted in an order as denoted by reference number 330, it may be possible to extract some selected LLR messages rather than all LLR messages.

Figure 4:
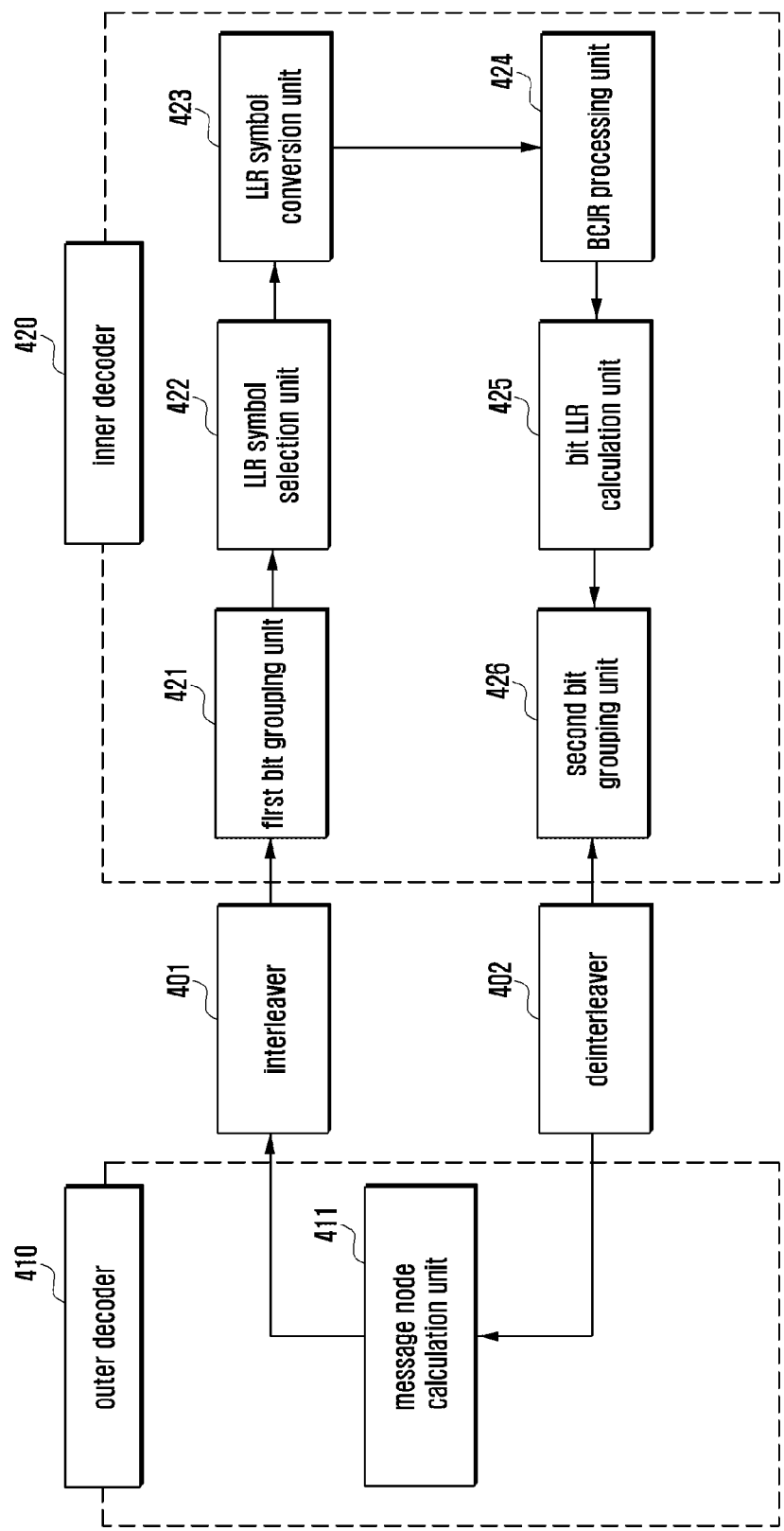
FIG. 4 is a block diagram illustrating a configuration of a binary IRPA code decoder to which the FQAM scheme can be applied according to another embodiment of the present invention.

FIG. 4 is a block diagram illustrating a configuration of a binary IRPA code decoder to which the FQAM scheme can be applied according to another embodiment of the present invention.

In reference to FIG. 4, the binary IRPA code decoder includes an outer decoder 410, an inner decoder 420, an interleaver 401, and a deinterleaver 402. The outer decoder 410 includes a message node calculation unit 411, and the inner decoder 420 includes a first grouping unit 421, an LLR symbol selection unit 422, an LLR symbol conversion unit 423, a BCJR processing unit 424, a bit LLR calculation unit 425, and a second bit grouping unit 426.

Before beginning the explanation of the decoder configured as above, a brief description is made of the optimal inner decoding algorithm. The optimal inner decoding algorithm has to group messages being exchanged with an outer decoder and perform complex operations such as BCJR algorithm computation of the inner decoder and lookup table computation. In order to simplify this process, it may be possible to perform decoding with an approximation formula similar to the method used in a legacy Turbo code or Low Density Parity Check (LDPC) code decoder.

The operations of the function blocks configured as above are described hereinafter with reference to FIG. 4. At the receiver, if a modulated signal is received and demodulated, the demodulated signal is input to the BCJR processing unit 424. It should be noted that the route through which the demodulated signal is received is not depicted in FIG. 4.

As described with reference to FIG. 2, the BCJR algorithm is characterized in that the inner decoder 420 calculates a posteriori LLR value of each code symbol effectively. The LLR value may be calculated by combining the information received through the channel and the extrinsic information of all symbols (with the exception of the symbol as the calculation target), e.g., LLR information received from the outer decoder 410 as a result of the previous iteration. The BCJR processing unit 424 uses an algorithm capable of acquiring the a posteriori LLR value effectively through a forward/backward recursion calculation, as in the Viterbi algorithm, in the trellis of the inner code. Since the BCJR algorithm is well-known in the art, a detailed description thereof is omitted herein.

In the state that the initially demodulated signal is input to the BCJR processing unit 424, there is no previous iteration, resulting in no information received from the outer decoder 410. Accordingly, if the initially demodulated signal is received, the BCJR processing unit 424 configures the algorithm to use only the demodulated signal or a predetermined value, e.g., 0 (zero), set as an input of the outer decoder. The value calculated through the BCJR algorithm at the BCJR processing unit 424 is input to the bit LLR calculation unit 425.

The bit LLR calculation unit 425 performs calculation on the symbol LLR value calculated by the symbol BCJR algorithm to generate a bit LLR value. The bit LLR value calculated by the bit LLR calculation unit 425 is input to the second bit grouping unit 426. The second bit grouping unit 426 restores a series of bit information from the bit LLR value and outputs the bit information to the deinterleaver 402.

The deinterleaver 402 performs deinterleaving in a predetermined manner, e.g., in the reverse process of interleaving at the transmitter, or in the reverse operation of interleaving at the interleaver 401 and outputs the deinterleaved bit information to the message node calculation unit 411 of the outer decoder 410. The message node calculation unit 411 performs outer decoding with the deinterleaved bit information and outputs the outer decoding result to the interleaver 401.

The decoding result of the outer decoder 410 is input to the interleaver 401. If the message calculated by the outer decoder 410 is input to the interleaver 401, the interleaver 401 performs interleaving on the demodulated signal with a predetermined interleaving scheme, e.g., the same scheme used in the transmitter, and outputs the interleaving result to the inner decoder 420. At this time, the interleaver may perform interleaving per bit. Accordingly, the output signal of the interleaver 401 is an interleaved bit signal.

The first bit grouping unit 421 of the inner decoder 420 receives the bits interleaved by the interleaver from the interleaver 401 and sorts the bits into groups, each of which consists of a predetermined number of the bits. This is a method for adjusting the code rate of the code. For example, the interleaver 401 may group two interleaved bits into one bit, three interleaved bits into one bit, or four interleaved bits into one bit. That is, the number of bits to be grouped into one bit is determined according to the code rate of the code.

The first bit grouping unit 421 converts the grouped data into an LLR symbol. The first bit grouping unit 421 may approximate the message received from the outer decoder 410. For example, the first bit grouping unit 421 may perform a log BP calculation using a hyper tangent (tan h) as a non-linear function. Here, the first bit grouping unit 421 may approximate the message with a scaled minimum sum (min-sum) scheme used as at the check nodes of LCDP code.

The scaled min-sum scheme performed at the bit grouping unit 421 may calculate the bit LLR value per bit as shown in Formula 1.

The first bit grouping unit 421 may perform a parity check before bit-unit LLA value determination to determine whether the decoding is successful or not. If no error is detected in the information decoded through the parity check, it is possible to output the interleaved data as the decoding result. The parity error check on the decoding result may be performed at every iteration of the iterative decoding between the inner decoder 420 and the outer decoder 410.

The LLR symbol selection unit 422 computes the sign of the bitLLR using the bit LLR value calculated as above. The LLR symbol selection unit 422 may perform the bit LLR code calculation with Formula 3.

$$\log Pr[a_i = 0] > \log Pr[a_i = 1] \text{ if } \log\frac{Pr[a_i = 0]}{Pr[a_i = 1]} > 0 \quad \text{[Formula 3]}$$

$$\log Pr[a_i = 0] < \log Pr[a_i = 1] \text{ if } \log\frac{Pr[a_i = 0]}{Pr[a_i = 1]} < 0$$

In Formula 3, pr denotes a probability value, and $a_i$ denotes the $i^{th}$ bit. By computing the sign of the bit LLR value using Formula 3, it is possible to determine whether the $i^{th}$ bit is likely to be 0 or 1.

The first bit grouping unit 421 performs grouping in units of a predetermined number of bits, which is determined according to the code rate as described above. For example, if the modulation order is 5, 5 bits are mapped to one LLR symbol. This means that each LLR symbol carries 5 bits.

The LLR symbol selection unit 422 may select the highest index among the indices of the respective 5 bit LLR symbols. Assuming a modulation order of 5, the signs of the 5 bit-LLR values are determined as in Formula 4.

$$\log\frac{Pr[a_0 = 0]}{Pr[a_0 = 1]} = \Lambda_0, \quad \text{[Formula 4]}$$

$$\log\frac{Pr[a_1 = 0]}{Pr[a_1 = 1]} = -\Lambda_1,$$

$$\log\frac{Pr[a_2 = 0]}{Pr[a_2 = 1]} = -\Lambda_2,$$

$$\log\frac{Pr[a_3 = 0]}{Pr[a_3 = 1]} = \Lambda_3,$$

$$\log\frac{Pr[a_4 = 0]}{Pr[a_4 = 1]} = \Lambda_4$$

Assuming that the values exemplified in Formula 4 have the highest value, the indices of Formula 4 may be the values calculated with respective bits. For example, $a_0=0$, $a_1=1$, $a_2=1$, $a_3=0$, and $a_4=0$. Since the index consisting of $a_4$, $a_3$, $a_2$, $a_1$, and $a_0$ corresponds to "00110", index 6 becomes the symbol LLR value with the highest value.

The LLR symbol selection unit 422 may store the index with the highest value (Smax) in a memory (not shown). The symbol LLR value of the index acquired by flipping bits as small as possible in the index with the highest value is likely to have the highest value. Accordingly, the LLR symbol selection unit 422 flips some bits in the index with the highest value to select the LLR symbols for use in the BCJR algorithm.

The LLR symbol selection unit 422 has to output grouped bit strings that become units of a predetermined number of LLR symbols. The LLR symbol selection unit 422 may output grouped bit strings obtained by flipping one or two bits in the index with the highest value.

Then the LLR symbol conversion unit 423 converts the bit LLR value to a symbol LLR and outputs the symbol LLR to the BCJR processing unit 424.

The BCJR processing unit 424 receives the LLR symbols from the LLR symbol conversion unit 423 and performs a BCJR algorithm on the LLR symbols. Since the BCJR algorithm has been described above with reference to FIG. 2 and other operations are performed with well-known algorithms, detailed descriptions thereof are omitted herein. As described above, as the BCJR processing unit 424 receives only a predetermined number of messages selected among all the symbol LLR vector messages, it is possible to reduce the computation complexity of the BCJR processing unit 424.

Since the operations of the bit LLR calculation unit 425 and the second bit grouping unit 426 have been described above, detailed descriptions thereof are omitted herein. The iterative decoding between the outer decoder 410 and the inner decoder 420 may be iteratively performed until the decoding is successful or for a predetermined number of times.

Figure 5:
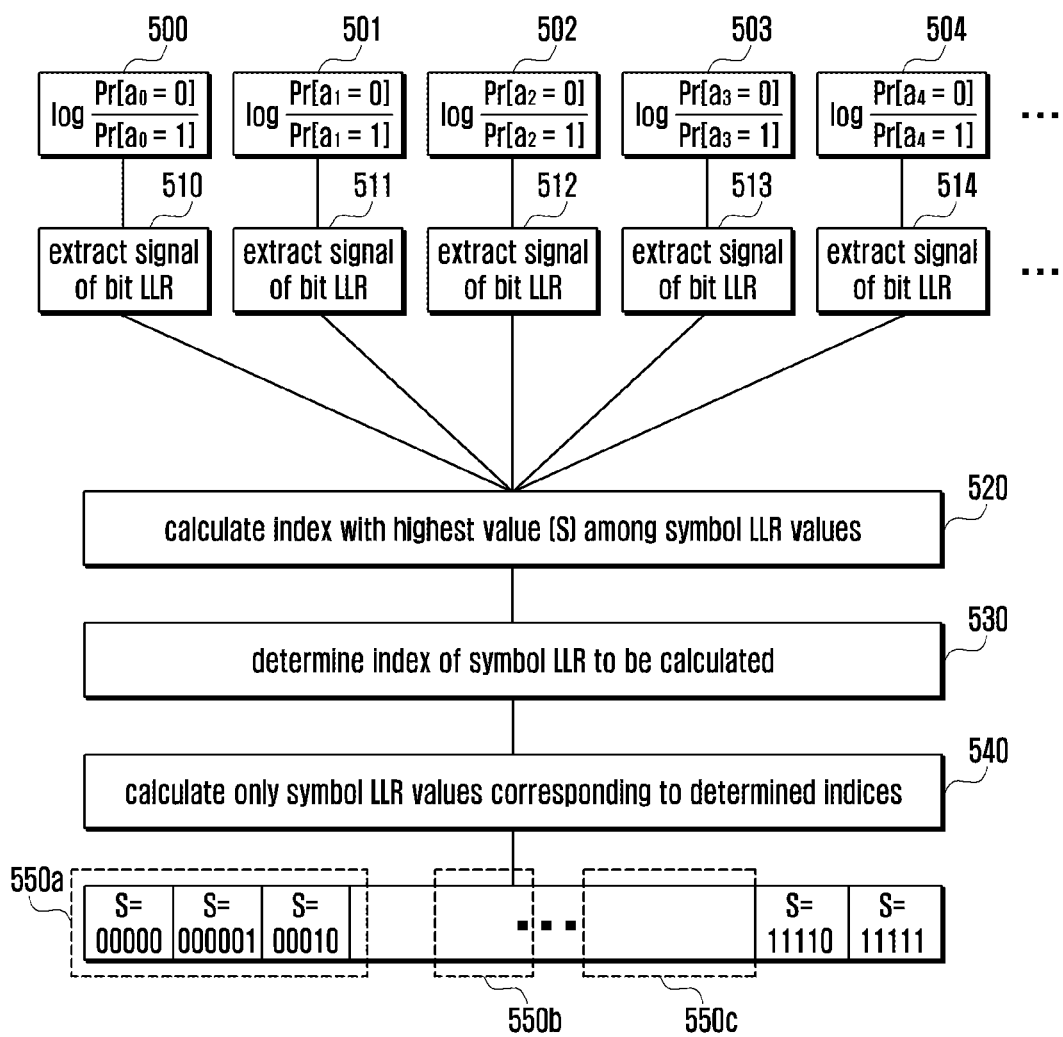
FIG. 5 is a conceptual diagram for explaining a symbol LLR message truncation method in an FQAM scheme according to another embodiment of the present invention.

FIG. 5 is a conceptual diagram for explaining a symbol LLR message truncation method in an FQAM scheme according to another embodiment of the present invention.

In reference to FIG. 5, the grouped bit LLR messages 500, 501, 502, 503, and 504 can be expressed as Formula 1. FIG. 5 exemplifies a case where 5 bit LLR messages are sorted into one group. However, it may also be possible to sort 5 or more bit LLR messages or less than 5 bit LLR messages into one group.

As shown in FIG. 5, it may be possible to extract signs of the bit LLR messages as denoted by reference numbers 510, 511, 512, 513, and 514. With the extracted signs, it is possible to calculate an index (S value) with the highest symbol LLR value as denoted by reference number 520. Next, the indices of the symbol LLRs to be calculated are determined as denoted by reference number 530, and only the symbol LLR values corresponding to the determined indices are calculated as denoted by reference number 540. The symbol LLR values corresponding to the determined indices are indicated by reference numbers 550a, 550b, and 550c.

The operations depicted in FIGS. 4 and 5 are described in more detail hereinafter.

Suppose that the modulation order (q) is 32 and the predetermined number of messages to select is 20. The modulation order of 32 may be expressed as $2^5$, and this means a 5-bit LLR value. Here, it is supposed that the signs of the respective bit LLR values are determined as exemplified by Formula 4.

As described above, if the bit LLR values have the signs as exemplified by Formula 4, the index may have the value of "00110" according to Formula 4.

In order to generate as many indices as necessary, it may be possible to generate the indices by flipping one bit, two bits, three bits, four bits, and five bits. The indices generated by flipping the bit(s) in this way are shown in Table 1.

TABLE 1

| | |
|---|---|
| Symbol LLR with highest value | (00110) |
| 1-bit flipped indices | (00111), (00100), (00010), (01110), (10110) |
| 2-bit flipped indices | (00101), (00011), (00000), (01111), (01100), (01010), (10111), (10100), (10010), (11110) |
| 3-bit flipped indices | (00001), (01101), (01011), (01000), (10101), (10011), (10000), (11111), (11100), (11010) |
| 4-bit flipped indices | (01001), (10001), (11101), (11011), (11000) |
| 5-bit flipped indices | (11001) |

It is possible to flip 1 to 5 bits of the symbol LLR with the highest value as shown in Table 1 and select $n_m$ indices in an order from the highest value to the smallest value and in the ascending order of the number of flipped bits among the symbol LLR indices. Let us refer to the 1-bit flipped indices in Table 1.

The index with the highest value is "00110". If one bit is flipped in the index, this means to flip one of the bits constituting the index with the highest value. Accordingly, if starting from the least significant bit, the one-bit flipped indices may be arranged in the order of "00111", "00100", "00010", "01110", and "10110". Table 1 shows the indices generated by flipping one to five bits in such an order.

As exemplified above, since $n_m$ is set to 20, there are 5 1-bit flipped indices, which does not meet the predetermined number of indices. Accordingly, it is necessary to consider adding 2-bit flipped indices. Since there are 10 2-bit flipped indices, the total number of groups capable of being secured with the 1-bit and 2-bit flipped indices is 16. Accordingly, it is necessary to consider adding 4 3-bit flipped indices.

As shown in Table 1, there are 10 3-bit flipped indices. If adding the first 4 3-bit flipped indices in the order arranged as shown in Table 1, the index "01000" is the last selected.

A method for selecting some of the indices with the same number of flipped bits is described hereinafter.

First, a necessary number of symbol indices may be selected randomly among all the symbol indices with the same number of flipped bits.

Second, a comparison may be made between the absolute values of m-bit LLR values to determine a bit position having the highest value and, if the LLR absolute value of the ith bit, then select the symbol indices in which the $i^{th}$ bit is not flipped first sequentially among all symbol indices with the same number of flipped bits.

Third, m-bit LLR values may be arranged in an order of the size of the absolute values thereof and then the symbol indices with the smallest absolute value may be selected first sequentially among all symbol indices with the same number of flipped bits.

Among the above three methods, the first one has the lowest complexity, the second one has the next lowest complexity, and the third one has the highest complexity. There is no difference in decoding performance among the three methods.

During the symbol LLR computation operation, it may be possible to calculate the symbol LLR values corresponding to the selected indices using the per-bit LLR values. As an example, they are calculated as shown in Table 2.

TABLE 2

| | |
|---|---|
| $\log \Pr[A = 00110] = \Lambda_0 + \Lambda_1 + \Lambda_2 + \Lambda_3 + \Lambda_4$ | |
| 1 bit Flip: | $\Lambda_0 + \Lambda_1 + \Lambda_2 + \Lambda_3 - \Lambda_4 \Lambda_0 + \Lambda_1 + \Lambda_2 - \Lambda_3 + \Lambda_4 \Lambda_0 + \Lambda_1 - \Lambda_2 + \Lambda_3 + \Lambda_4 \Lambda_0 - \Lambda_1 + \Lambda_2 + \Lambda_3 + \Lambda_4$ |
| 2 bit Flip: | $\Lambda_0 + \Lambda_1 + \Lambda_2 - \Lambda_3 - \Lambda_4 \Lambda_0 + \Lambda_1 - \Lambda_2 + \Lambda_3 - \Lambda_4 \Lambda_0 + \Lambda_1 - \Lambda_2 - \Lambda_3 + \Lambda_4 \Lambda_0 - \Lambda_1 + \Lambda_2 + \Lambda_3 - \Lambda_4 \Lambda_0 - \Lambda_1 + \Lambda_2 - \Lambda_3 + \Lambda_4 \Lambda_0 - \Lambda_1 - \Lambda_2 + \Lambda_3 + \Lambda_4 - \Lambda_0 + \Lambda_1 + \Lambda_2 + \Lambda_3 - \Lambda_4 - \Lambda_0 + \Lambda_1 + \Lambda_2 - \Lambda_3 + \Lambda_4 - \Lambda_0 + \Lambda_1 - \Lambda_2 + \Lambda_3 + \Lambda_4 - \Lambda_0 -$ |

TABLE 2-continued log Pr [A = 00110] = $\Lambda_0 + \Lambda_1 + \Lambda_2 + \Lambda_3 + \Lambda_4$

| | |
|---|---|
| 3 bit Flip: | $\Lambda_1 + \Lambda_2 + \Lambda_3 + \Lambda_4$<br>$\Lambda_0 + \Lambda_1 - \Lambda_2 - \Lambda_3 - \Lambda_4$ $\Lambda_0 - \Lambda_1 + \Lambda_2 - \Lambda_3 - \Lambda_4$ $\Lambda_0 - \Lambda_1 -$<br>$\Lambda_2 + \Lambda_3 - \Lambda_4$ $\Lambda_0 - \Lambda_1 - \Lambda_2 - \Lambda_3 + \Lambda_4$ |

The indices selected as shown in Table 2 and the calculated symbol LLR values may be stored. Afterward, the BCJR algorithm may be performed on the symbol LLR values calculated as above.

Figure 6:
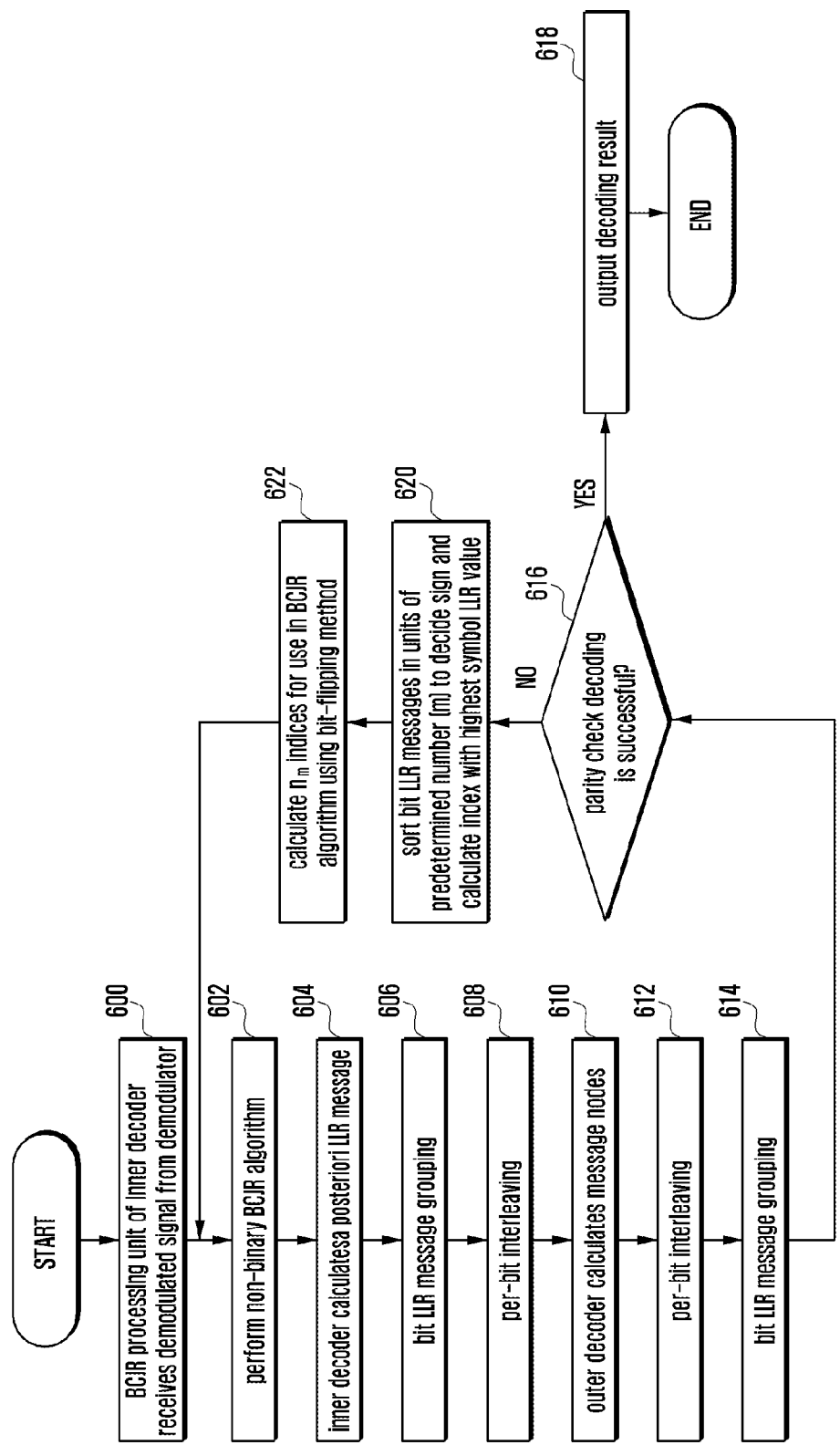
FIG. 6 is a flowchart illustrating a symbol decoding operation of a decoder according to an embodiment of the present invention.

FIG. 6 is a flowchart illustrating a symbol decoding operation of a decoder according to an embodiment of the present invention. The embodiment of FIG. 6 is described using the configuration of FIG. 4.

In reference to FIG. 6, if a signal is received from a transmitter, the receiver may modulate the received signal. The BCJR processing unit 424 of the inner decoder 420 receives the demodulated signal from the demodulator at step 600. Next, the BCJR processing unit 424 may perform a non-binary BCJR algorithm at step 602. Since the non-binary BCJR algorithm is well-known in the art, a detailed description thereof is omitted herein.

The data processed by the BCJR processing unit 424 is input to the bit LLR calculation unit 425, which performs a posteriori LLR message computation on the data at step 604. Next, at step 606, the second bit grouping unit 426 performs grouping in units of a predetermined number of bits using the output of the bit LLR calculation unit 425.

The data grouped by the second bit grouping unit 426 is input to the deinterleaver 402. The deinterleaver 402 performs deinterleaving per bit at step 608 and outputs deinterleaved bit strings to the outer decoder 410. At this time, the deinterleaving may be a reverse operation of the interleaving performed at the transmitter or performed by the interleaver 401.

The message node calculation unit 411 of the outer decoder 410 performs message node calculation at step 610 and outputs the calculation result to the interleaver 401. The interleaver 401 performs interleaving at step 612. The interleaving scheme performed by the interleaver 401 may be identical with the interleaving scheme of the transmitter.

The bit strings as the interleaving result of the interleaver 401 are input to the inner decoder 420. The first bit grouping unit 421 of the inner decoder 420 may perform the grouping operation in units of a predetermined number of bits, and the grouping unit may be determined according to the code rate. As described above, the grouping may be performed in units of 5 bits.

Next, the first bit grouping unit 421 may perform a parity check with the grouped data at step 616. If it is determined that the data decoding has succeeded based on the parity check result, the decoding result is output at step 618.

Otherwise, if it is determined that the decoding has failed based on the parity check with the grouped data at the first bit grouping unit 421, the procedure goes to step 620. If the decoding has failed, the LLR symbol conversion unit 422 sorts the bit LLR messages in units of a predetermined number, e.g., m, to decide the sign and calculates an index with the highest symbol LLR value. Next, the LLR symbol conversion unit 422 may calculate $n_m$ indices for use in the BCJR algorithm through bit-flipping in the indices with the highest symbol LLR value at step 622. This can be accomplished using the methods described with reference to Table 2.

Although not shown in FIG. 6, the LLR symbol conversion unit 423 may convert the LLR values corresponding to the $n_m$ selected indices to LLR symbols and outputs the LLR symbols to the BCJR processing unit 424.

The above methods are described hereinafter in view of complexity.

It is supposed that the modulation order (q) is 32, the number of messages to select ($n_m$) is 20, and number of information bits is 960. Also, it is supposed that the code rate is 1/3.

A description is made hereinafter of the case of selecting 20 messages of symbol vectors using a method of sorting to select the highest value according to the first embodiment of FIGS. 2 and 3.

In the case of selecting 20 messages ($n_m$=20), the operation amount decreases about 23.7% in comparison with the legacy algorithm. The operation amount caused by use of sorting is about 31.6% of the operation amount of the legacy algorithm. This means that the method of selecting 20 messages increases the complexity about 7.9% in comparison with the legacy algorithm. The increase of complexity is caused by the extra operation for sorting the messages.

A description is made hereinafter of the case of selecting only symbol LLRs for a calculation according to the second embodiment of FIGS. 4 to 6.

The method according to the second embodiment performs message selection to decrease the number of messages, resulting in about a 33.1% reduction of the operation amount in comparison with the legacy algorithm. The extra operation amount caused by selecting symbol LLR calculation indices is about 2.5% in comparison with the operation amount of the legacy algorithm. In total, there is about a 30.6% reduction in complexity in comparison with the legacy algorithm. This shows that the method according to the second embodiment improves the complexity of the decoder.

Figure 7A:
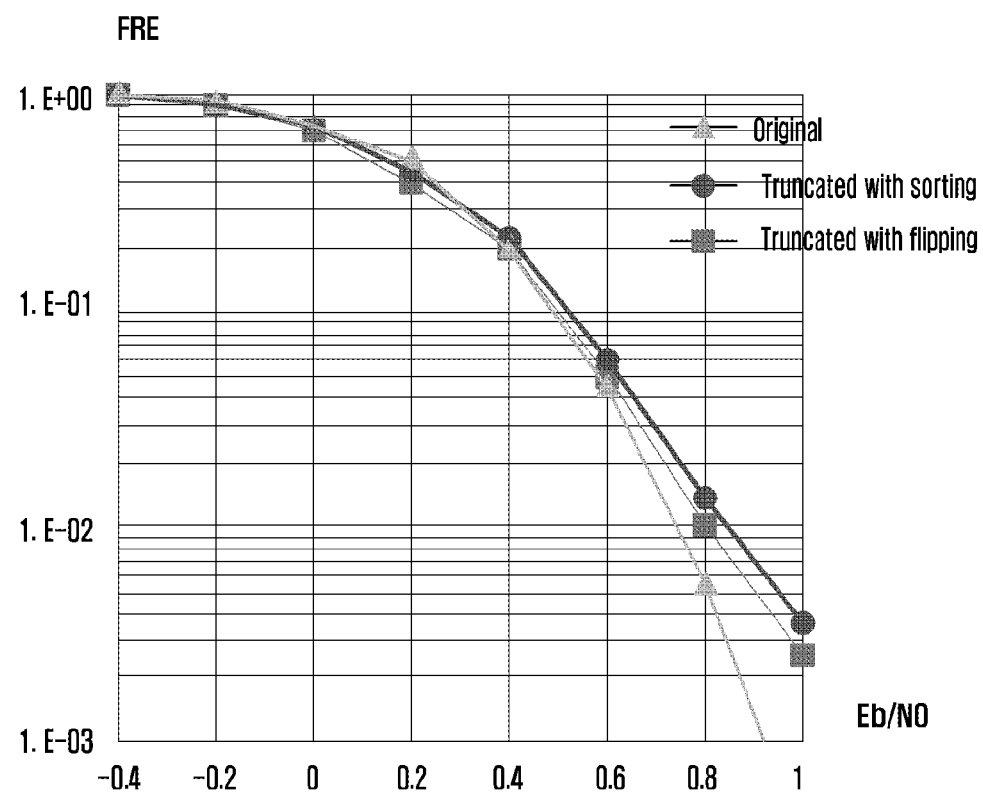
FIGS. 7A and 7B are graphs showing performance simulation results of the decoders according to the embodiments of the present invention and the legacy decoder.
Figure 7B:
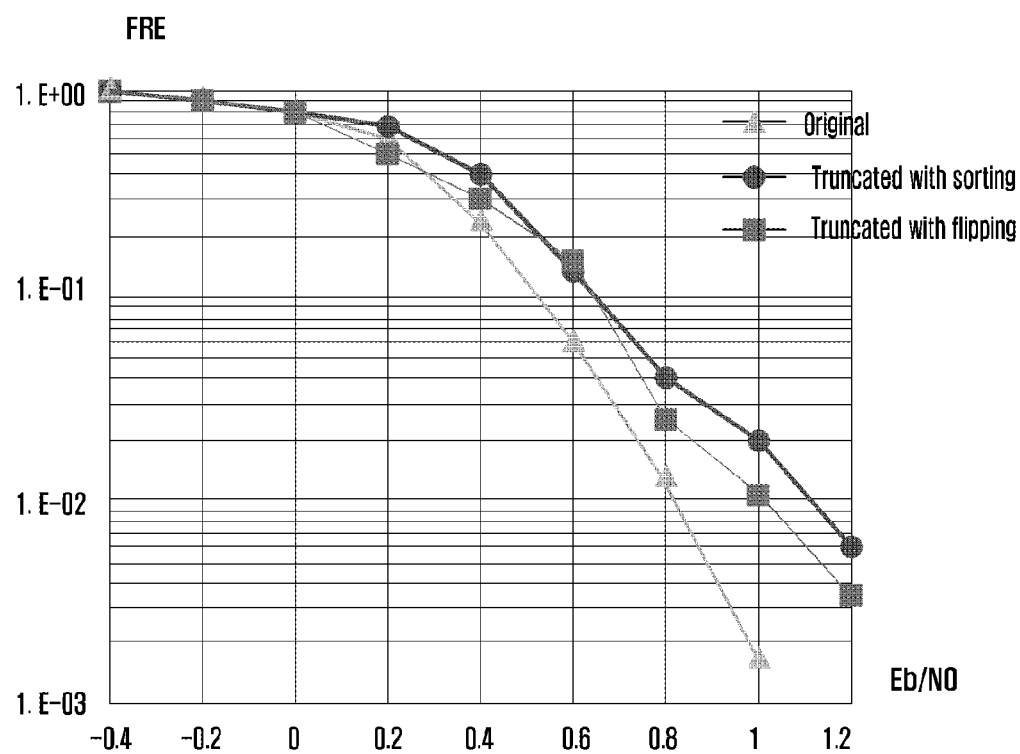

FIGS. 7A and 7B are graphs showing performance simulation results of the decoders according to the embodiments of the present invention and the legacy decoder.

In FIG. 7A, the number of information bits is set to 960, the modulation order is set to 32 (4FSK+8PSK), and the doping period is set to 30. Also, the code rate is set to 1/3.

In reference to FIG. 7A, the legacy decoder has the coordinates marked with "Δ", the decoder according to the first embodiment has the coordinates marked with "○", and the decoder according to the second embodiment has the coordinates marked with "□". From the graph, it is apparent that both the methods according to the first and second embodiments show a performance loss equal to or less than 0.1 dB. This means that the two proposed methods show no significant performance degradation.

In FIG. 7B, the number of information bits is set to 960, the modulation order is set to 32 (8FSK+4PSK), and the doping period is set to 30. Also, the code rate is set to 1/3.

In reference to FIG. 7B, the legacy decoder has the coordinates marked with "Δ", the decoder according to the first embodiment has the coordinates marked with "602", and the decoder according to the second embodiment has the coordinates marked with "□". From the graph, it is apparent that the method of the first embodiment shows a performance loss of about 0.3 dB and the method of the second embodiment shows a performance loss of about 0.2 dB. That is, the method of the second embodiment shows a performance degradation less than that of the method of the first embodiment.

Although various embodiments of the present disclosure have been described using specific terms, the specification and drawings are to be regarded in an illustrative rather than a restrictive sense in order to help understand the present invention. It is obvious to those skilled in the art that various modifications and changes can be made thereto without departing from the broader spirit and scope of the invention.

INDUSTRIAL APPLICABILITY

The present invention is applicable to communication systems.

The invention claimed is:

1. A decoder of a receiver equipped with an inner decoder and an outer decoder for iterative decoding in a system using a binary irregular repeat and partial accumulate code, the inner decoder configured to:
   group bits received from the outer decoder according to a decoding order;
   calculate indices of the grouped bits with a highest probability among the grouped bits and select and output a predetermined number of grouped bit log likelihood ratio (LLR) values;
   convert the grouped bit LLR values to symbol LLR values and output the symbol LLR values;
   perform a Bahl-Cocke-Jelinek-Raviv (BCJR) algorithm with the symbol LLR values;
   convert outputs of the BCJR algorithm with the symbol LLR values to bit LLR values; and
   group the bit LLR values in units of a predetermined number of bits.

2. The decoder of claim 1, wherein the inner decoder is further configured to generate grouped indices by flipping at least one of the grouped bits with the highest probability to acquire a predetermined number of indices in selecting the predetermined number of grouped bit LLR values.

3. The decoder of claim 2, wherein the inner decoder is further configured to select, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, a necessary number of symbol indices randomly among all candidate symbol indices acquired by flipping the same number of bits.

4. The decoder of claim 2, wherein the inner decoder is further configured to compare, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, absolute values of the bit LLR values among all candidate symbol indices acquired by flipping the same number of bits and selects the bits having a highest value in series.

5. The decoder of claim 2, wherein the inner decoder is further configured to sort, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, absolutes values of the bit LLR values among all candidate symbol indices acquired by flipping the same number of bits in an order of size and selects the symbol indices with a smallest number of flipped bits in association with the absolute values.

6. The decoder of claim 1, wherein the predetermined number of bit LLR values is determined depending on a channel condition.

7. The decoder of claim 1, wherein the predetermined number of bit LLR values is set to be a value reversely in proportion to a number of iterations between the outer and inner decoders.

8. A decoding method of an inner decoder of a receiver of a system performing iterative decoding with the inner decoder and an outer decoder and using a binary irregular repeat and partial accumulate code, the decoding method comprising:
   grouping bits received from the outer decoder according to a decoding order;
   calculating indices of the grouped bits with a highest probability among the grouped bits;
   selecting and outputting a predetermined number of grouped bit log likelihood ratio (LLR) values;
   converting the grouped bit LLR values to symbol LLR values and outputting the symbol LLR values;
   performing a BCJR algorithm on the symbol LLR values;
   converting BCJR processing results to bit LLR values; and
   grouping the bit LLR values in units of a predetermined number of bits.

9. The decoding method of claim 8, wherein selecting the grouped bit LLR values comprises generating grouped indices by flipping at least one of the grouped bits with the highest probability to acquire a predetermined number of indices in selecting the predetermined number of grouped bit LLR values.

10. The decoding method of claim 9, wherein selecting the grouped bit LLR values comprises selecting, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, a necessary number of symbol indices randomly among all candidate symbol indices acquired by flipping the same number of bits.

11. The decoding method of claim 9, wherein selecting the grouped bit LLR values comprises comparing, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, absolute values of the bit LLR values among all candidate symbol indices acquired by flipping the same number of bits and selecting the bits having a highest value in series.

12. The decoding method of claim 9, wherein selecting the grouped bit LLR values comprises sorting, when the indices acquired by flipping a same number of bits among the indices of the grouped bits with the highest probability in selecting the predetermined number of the grouped bit LLR values is equal to or greater than 2 and part of the indices acquired by flipping the same number of bits are required to be output, absolutes values of the bit LLR values among all candidate symbol indices acquired by flipping the same number of bits in an order of size and selecting the symbol indices with a smallest number of flipped bits in association with the absolute values.

13. The decoding method of claim 8, wherein the predetermined number of bit LLR values is determined depending on a channel condition.

14. The decoding method of claim 8, wherein the predetermined number of bit LLR values is set to be a value reversely in proportion to a number of iterations between the outer and inner decoders.

15. An decoder of a receiver equipped with an inner decoder and an outer decoder for iterative decoding in a system using a binary irregular repeat and partial accumulate code, the inner decoder configured to:

group bits received from the outer decoder according to a decoding order;

convert the grouped bits to log likelihood ratio (LLR) symbols;

sort elements of vectors of the LLR symbols in an order of size and select a predetermined number of symbol LLR values in series in a descending order of symbol LLR values;

perform a Bahl-Cocke-Jelinek-Raviv (BCJR) algorithm on the symbol LLR values output;

convert outputs of the BCJR algorithm with the symbol LLR values to bit LLR values; and group the bit LLR values in units of a predetermined number of bits.

16. The decoder of claim 15, wherein the predetermined number of symbol LLR values is determined depending on a channel condition.

17. The decoder of claim 15, wherein the predetermined number of symbol LLR values is set to be a value reversely in proportion to a number of iterations between the outer and inner decoders.

18. A decoding method of an inner decoder of a receiver of a system performing iterative decoding with the inner decoder and an outer decoder and using a binary irregular repeat and partial accumulate code, the decoding method comprising:

grouping bits received from the outer decoder according to a decoding order;

converting the grouped bits to log likelihood ratio (LLR) symbols;

sorting elements of vectors of the LLR symbols in an order of size and selecting a predetermined number of symbol LLR values in series in a descending order of symbol LLR value;

performing a BCJR algorithm on the symbol LLR values;

converting BCJR process results to bit LLR values; and grouping the bit LLR values in units of a predetermined number of bits.

19. The decoding method of claim 18, wherein the predetermined number of symbol LLR values is determined depending on a channel condition.

20. The decoding method of claim 18, wherein the predetermined number of symbol LLR values is set to be a value reversely in proportion to a number of iterations between the outer and inner decoders.

* * * * *